(12) United States Patent
Kaufmann et al.

(10) Patent No.: US 10,816,611 B2
(45) Date of Patent: Oct. 27, 2020

(54) MEASURING SYSTEM

(71) Applicant: TDK—Micronas GmbH, Freiburg (DE)

(72) Inventors: Timo Kaufmann, Waldkirch-Suggental (DE); Joerg Franke, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 206 days.

(21) Appl. No.: 15/666,050

(22) Filed: Aug. 1, 2017

(65) Prior Publication Data
US 2018/0031643 A1 Feb. 1, 2018

(30) Foreign Application Priority Data
Aug. 1, 2016 (DE) .................. 10 2016 009 209

(51) Int. Cl.
*G01R 33/00* (2006.01)
*G01B 7/02* (2006.01)
*G01R 33/02* (2006.01)
*G01R 33/07* (2006.01)
*G01R 33/038* (2006.01)
(Continued)

(52) U.S. Cl.
CPC ......... *G01R 33/0005* (2013.01); *G01B 7/023* (2013.01); *G01R 33/0011* (2013.01); *G01R 33/0047* (2013.01); *G01R 33/0082* (2013.01); *G01R 33/02* (2013.01); *G01R 33/038* (2013.01); *G01R 33/07* (2013.01); *G01R 33/3802* (2013.01); *G01D 5/145* (2013.01)

(58) Field of Classification Search
CPC .... G01D 5/147; G01D 11/245; G01R 35/005; G01R 33/09
See application file for complete search history.

(56) References Cited

U.S. PATENT DOCUMENTS

| | | | |
|---|---|---|---|
| 5,781,005 A * | 7/1998 | Vig | G01D 5/147 324/207.2 |
| 5,963,028 A | 10/1999 | Engel et al. | |
| 6,265,865 B1 | 7/2001 | Engel et al. | |

(Continued)

FOREIGN PATENT DOCUMENTS

| | | |
|---|---|---|
| DE | 10009173 A1 | 9/2001 |
| DE | 69827559 T2 | 12/2005 |

(Continued)

*Primary Examiner* — Son T Le
*Assistant Examiner* — Adam S Clarke
(74) *Attorney, Agent, or Firm* — Muncy, Geissler, Olds & Lowe, P.C.

(57) ABSTRACT

A measuring system having a magnetic device for generating a magnetic field and at least one magnetic field sensor for detecting a flux density of the magnetic field, at least in a first spatial direction. The magnetic device has a top side facing the magnetic field sensor, the magnetic field sensor is spaced apart from the top side of the magnetic device, the magnetic device has a main magnet, having two poles, with a main magnetizing direction for generating a main magnetic field and at least one secondary magnet, having two poles, with a secondary magnetization direction for generating a secondary magnetic field, the main magnet has larger dimensions than the at least one secondary magnet, the magnetic field is formed by superposition of the main magnetic field and the secondary magnetic field, the secondary magnetic field at least partially compensates the main magnetic field in the first spatial direction.

14 Claims, 2 Drawing Sheets

(51) Int. Cl.
    *G01R 33/38*     (2006.01)
    *G01D 5/14*     (2006.01)

(56) References Cited

U.S. PATENT DOCUMENTS

| | | |
|---|---|---|
| 6,278,269 B1 | 8/2001 | Vig et al. |
| 6,356,177 B1 * | 3/2002 | Ogura ................ F16F 6/005 |
| | | 335/207 |
| 6,922,052 B2 | 7/2005 | Steinruecken et al. |
| 8,680,847 B2 | 3/2014 | Franke et al. |
| 9,000,763 B2 | 4/2015 | Ausserlechner |
| 9,513,343 B2 | 12/2016 | Heberle et al. |
| 9,513,344 B2 | 12/2016 | Ausserlechner |
| 2007/0018642 A1 * | 1/2007 | Ao ........................ G01D 5/145 |
| | | 324/252 |
| 2013/0140652 A1 * | 6/2013 | Erdler ..................... H01L 27/22 |
| | | 257/415 |
| 2014/0333298 A1 * | 11/2014 | Heberle ............ G01R 33/0017 |
| | | 324/228 |
| 2014/0333299 A1 * | 11/2014 | Heberle ............... G01R 33/038 |
| | | 324/228 |
| 2015/0022189 A1 | 1/2015 | Yasuda et al. |
| 2019/0271568 A1 * | 9/2019 | Kozomora ........... G01R 33/072 |

FOREIGN PATENT DOCUMENTS

| | | |
|---|---|---|
| DE | 102012203001 A1 | 8/2012 |
| DE | 102013007902 A1 | 11/2014 |
| WO | WO2010060607 A2 | 6/2010 |

\* cited by examiner

MEASURING SYSTEM

This nonprovisional application claims priority under 35 U.S.C. § 119(a) to German Patent Application No. 10 2016 009 209.2, which was filed in Germany on Aug. 1, 2016, and which is herein incorporated by reference.

BACKGROUND OF THE INVENTION

Field of the Invention

The present invention relates to a measuring system.

Description of the Background Art

WO 2010/060607 A2 discloses an IC package with a semiconductor chip with an integrated circuit and an integrated magnetic sensor. A permanent magnet, whose magnetic flux penetrates the sensor, is spaced apart from the semiconductor chip package. If an object to be measured approaches the head end of the semiconductor chip, the magnetic flux density through the sensor changes.

U.S. Pat. No. 7,250,760 B2 discloses integrated magnetic Hall sensors in which a permanent magnet with the sensor is disposed in the IC package. In this case, the Hall sensors are arranged relative to the field of the permanent magnet such that a Hall voltage is generated without an external field effect. Furthermore, arrangements with magnetic field sensors and permanent magnets are known from DE 100 09 173 A1 (which corresponds to U.S. Pat. No. 6,922,052) and from U.S. Pat. No. 6,278,269 B1.

DE 698 27 559 T2, which corresponds to U.S. Pat. No. 5,963,028, discloses a package for a magnetic field sensor. An air gap is typically defined as the distance between an exciter and the outer surface of the package that contains a sensing element of the magnetic field sensor. An "effective air gap" can be described as the distance between the exciter and the sensing element itself. Magnetic field sensors typically contain a permanent magnet and a sensing element, which is encapsulated in a package.

This package type is not suitable for harsh environments, however, particularly those in an automobile. Therefore, sensing elements packaged in such a way are enclosed further in an additional package (overmold), which provides protection from moisture and dirt. This results in a decrease in the peak magnetic field strength, as a tooth passes through the magnetic field in proximity to the sensing element. It is desirable in DE 698 27 559 T2 to have the sensing element as close as possible to the magnet, because the magnetic field decreases as a function of the air gap. A smaller distance allows the use of a small magnet with a lower energy product.

DE 10 2012 203 001 A1, which corresponds to US 2012/0217960, and which discloses a 3D magnetic sensor. The magnetic field sensor has a flat soft-magnetic body, which is arranged on a surface of a substrate, which has a magnetic sensor array having a plurality of spatially diverse magnetic sensor elements, arranged in a predefined configuration. In the presence of an external magnetic field, the flat soft-magnetic body is magnetized to generate a reaction magnetic field.

The majority of magnetic sensor elements is configured to measure a magnetic field value of a superposition of the external magnetic field and of the reaction magnetic field along a first axis (e.g., a z-axis), which results in a plurality of spatially diverse measurements of the magnetic field component along the first axis. The plurality of spatially diverse measurements can be used to compute magnetic field components of the external magnetic field along a plurality of axes (e.g., x-axis, y-axis, and z-axis).

DE 10 2013 007 902 A1, which corresponds to US 2014/0333298, which is incorporated herein by reference, and which discloses a magnetic device for generating an offset magnetic field for a magnetic field sensor which has two main poles as well as at least two secondary poles, wherein a main magnetic field generated by the main poles is at least partially compensated by a secondary magnetic field generated by the secondary poles.

SUMMARY OF THE INVENTION

It is therefore an object of the invention to improve a measuring system as much as possible.

According to an exemplary embodiment of the invention, a measuring system is provided having a magnetic device for generating a magnetic field and at least one magnetic field sensor for detecting a flux density of the magnetic field at least in a first spatial direction.

The magnetic device comprises a main magnet, having two permanent magnetic poles, with a main magnetization direction for generating a main magnetic field and at least one secondary magnet, having two permanent magnetic poles, with a secondary magnetization direction for generating a secondary magnetic field, wherein the main magnet has larger dimensions than the at least one secondary magnet.

The magnetic field is formed by superimposing the main magnetic field and the secondary magnetic field, whereby the secondary magnetic field at least partially compensates the main magnetic field in the first spatial direction.

Furthermore, the magnetic device has a top side, facing the at least one magnetic field sensor, whereby the at least one magnetic field sensor is spaced apart from the top side of the magnetic device.

The top side of the magnetic device is formed as a planar surface with a first surface region and a second surface region, wherein the first surface region is formed by at least one pole of the main magnet, the second surface region is formed by at least one pole of the at least one secondary magnet, and the magnetic field sensor at least partially covers the second surface region in a projection extending perpendicular to the top side of the magnetic device.

It should be noted that the magnetization direction can be essentially a direction along which the polarity of a permanent magnet changes from the south pole to the north pole. Because the magnetic flux of the main magnet is partially compensated by the secondary magnets, the two magnetization directions are preferably antiparallel with respect to the first spatial direction.

The measuring system can be designed to detect the presence of an encoder. In this case, the encoder comprises a ferromagnetic material.

In an embodiment, for example, if the planar surface of the magnet is formed in the x-y plane, the magnetic field sensor is spaced apart in the z-direction above the planar surface. It is understood further that, in the case of a measurement, an encoder can be disposed in the z-direction above the magnetic field sensor, and a magnetic flux is generated in the presence of the encoder in at least the first direction, in the present embodiment the z-direction.

It should also be noted that the secondary magnet can be produced by a remagnetization of regions in the main magnet, and the magnet is formed overall integrally or, in other words, monolithically.

In an embodiment, the main magnet has a recess, wherein the recess represents a negative shape of the secondary magnet so that the entire magnet is formed in two parts.

The at least one magnetic field sensor can be monolithically integrated in a semiconductor body or is arranged on the surface thereof. The semiconductor body can comprise a control and evaluation circuit. The control and evaluation circuit has an electrical operative connection to the magnetic field sensor.

It is possible to locally modify the magnetic field of a magnet in such a way that, compared with an original state without modification, it has a magnetic flux density component markedly reduced at certain points within the space for magnetic field sensors.

A region with a low or no magnetic flux density can be formed above the planar surface in a section along the first spatial direction. In other words, it is desirable to reduce the magnetic flux density in the first spatial direction in the region to zero, i.e., ideally to achieve a so-called zero-field arrangement.

The magnetic field sensor can be disposed in a region of the reduced magnetic field, for example, the zero field, so that the magnetic field sensor generates only a low signal or no signal in a low-flux or preferably flux-free region in the absence of the encoder.

Here, the term zero field or low-flux region can refer to the magnetic field magnetic component to be measured, for example, the component in the z-direction.

The measuring system produces a working region greater than or equal to twice the distance of the target to the active magnetic field sensor in relation to the distance of the active magnetic field sensor to the magnetic surface. In other words, the distance between the encoder and the magnetic field sensor is at least twice as great as the distance between the magnetic field sensor and the planar surface of the magnet.

As the magnitude of the magnetic flux (without an encoder) occurs as an offset in the output signal of the magnetic field sensor, a reduction in the magnetic flux reduces the offset and increases the signal-to-offset ratio significantly. The reduction of the magnetic flux density component in the present case is achieved by more than two magnetic poles.

An advantage of the device of the invention is that a very good signal-to-offset ratio is achieved with a simple and thus cost-effective magnetic device. In the case of an arrangement of the magnetic field sensor in the low-flux or flux-free region, the magnetic field sensor generates a particularly high signal only in the presence of an encoder or a so-called target. The term 'particularly high signal' is understood here to mean that the signal of the magnetic field sensor increases more strongly in the presence of the encoder in comparison with an arrangement in the original state (without the encoder).

According to an embodiment, the second surface region of the top side can be completely enclosed by the first surface region or the second surface region can be surrounded by the first surface region on two opposite sides.

According to an embodiment, the magnetic device can be made cuboid or cylindrical, a base surface forming the top side of the magnetic device.

According to an embodiment, the at least one secondary magnet can be made cuboid or cylindrical.

According to an embodiment, the main magnetization direction of the main magnet can be oriented parallel or antiparallel to the secondary magnetization direction of the at least one secondary magnet.

According to an embodiment, the main magnetization direction of the main magnet can be oriented orthogonal to the secondary magnetization direction of the at least one secondary magnet.

According to an embodiment, the magnetic device comprises a first secondary magnet with a first secondary magnetization direction and a second secondary magnet with a second secondary magnetization direction.

According to an embodiment, the first secondary magnetization direction runs parallel or antiparallel to the second secondary magnetization direction.

According to an embodiment, the measuring system comprises a first magnetic field sensor and a second magnetic field sensor, wherein the first magnetic field sensor and the second magnetic field sensor are arranged next to one another in a plane, extending parallel to the top side of the magnetic device, and the first magnetic field sensor covers the first secondary magnet and the second magnetic field sensor covers the second secondary magnet at least partially or completely in a projection perpendicular to the top side.

According to an embodiment, the main magnetization direction of the main magnet runs orthogonal or substantially parallel to the top side of the magnetic device.

In an embodiment, the secondary magnetization direction of the secondary magnet runs orthogonal or substantially parallel to the top side of the magnetic device.

According to an embodiment, the magnetic device and the magnetic field sensor are integrated in a component package, the component package being designed for mounting on a circuit board.

According to an embodiment, the measuring system has an encoder which is movable at least in one direction relative to the magnetic device.

In an embodiment, the first magnetic field sensor and/or the second magnetic field sensor are designed as a Hall sensor, as a 1D Hall sensor, for example, in the form of a Hall plate.

Alternatively, the first magnetic field sensor and/or the second magnetic field sensor are designed as a 2D Hall sensor or as a 3D Hall sensor. Whereas the 2D Hall sensor detects two components of the magnetic field, the 3D Hall sensor can detect all three components of the magnetic field.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
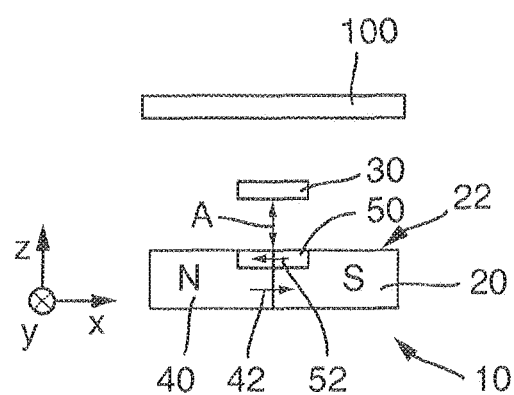
FIG. 1 shows a schematic sectional illustration of an embodiment of a measuring system of the invention.

The illustration in FIG. 1 shows a schematic sectional view of an embodiment of a measuring system 10 of the invention for determining the position of an encoder 100 at least in a first spatial direction.

Figure 2:
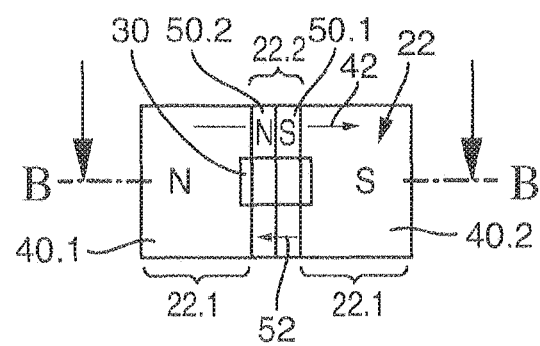
FIG. 2 shows a schematic plan view of an embodiment of the measuring system according to FIG. 1.

FIG. 2 shows a top view of the measuring system from FIG. 1, FIG. 1 corresponding to a sectional view along the straight line B-B from FIG. 2. In addition, a coordinate system with the spatial directions x, y, and z is shown in FIG. 1.

Measuring system 10 has a magnetic device 20 for generating a magnetic field and a magnetic field sensor 30 for detecting a flux density of the magnetic field at least in a first spatial direction, in the present case in the z-direction.

Magnetic field sensor 30 is fixedly positioned at a distance A from a top side 22 of magnetic device 20, for example, by plastic by means of a positive connection. Magnetic field sensor 30, for example, a Hall plate, measures the flux density of the magnetic field in a first spatial direction, in the illustrated exemplary embodiment, e.g., the magnetic flux density along the z-direction.

Magnetic device 20 has a main magnet 40 and a secondary magnet 50, wherein main magnet 40 includes a south pole 40.1 and a north pole 40.2, and the secondary magnet 50 includes a south pole 50.1 and a north pole 50.2. South pole 40.1 and north pole 40.2 of main magnet 40 are arranged one after the other along the x-direction in the indicated sequence, so that a main magnetization direction 42 of main magnet 40, said direction pointing from south pole 40.1 to north pole 40.2, points in the x-direction.

A corresponding secondary magnetization direction 52, which points from south pole 50.1 to north pole 50.2, runs antiparallel to main magnetization direction 42 or counter to the x-direction because south pole 50.1 of secondary magnet 50 in the illustrated embodiment is arranged along the x-direction to north pole 50.2 of secondary magnet 50.

The magnetic field is formed by superimposing the main magnetic field and the secondary magnetic field, wherein the secondary magnetic field at least partially, preferably completely, compensates the main magnetic field in the first spatial direction, in the illustrated exemplary embodiment, the z-direction. In the present embodiment, the magnetic field is preferably at least partially compensated in the x-direction or the y-direction as well.

In the illustrated embodiment, secondary magnet 50 is made cuboid and significantly smaller than main magnet 40. Secondary magnet 50 is arranged in a recess of main magnet 40, secondary magnet 50 extending over an entire width of main magnet 40.

The recess of main magnet 40 corresponds to a negative shape of secondary magnet 50, so that top side 22 of magnetic device 20 is formed as a planar surface, and a first region 22.1 is formed by south pole 40.1 and north pole 40.2 of main magnet 40, and a second region 22.2 is formed by south pole 50.1 and north pole 50.2 of secondary magnet 50.

Magnetic field sensor 30 is arranged in the region of secondary magnet 50 above top side 22 of magnetic device 20, so that magnetic field sensor 30 at least partially covers secondary magnet 50 in a projection perpendicular to top side 22.

Further embodiments of the measuring system of the invention are shown in the further illustrations in FIGS. 3 to 10. Only the differences from the illustration in FIG. 1 or the previous illustrations will be explained below.

Figure 3:
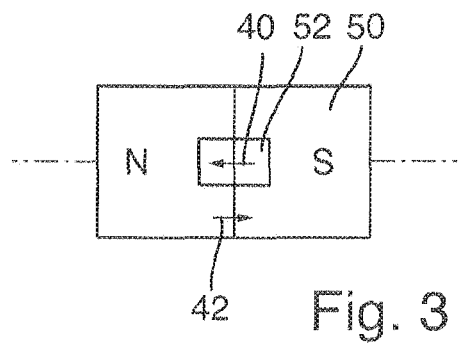
FIG. 3 shows a schematic plan view of an embodiment of the measuring system of the invention.

In the embodiment shown in FIG. 3, secondary magnet 40 is made significantly smaller in comparison to the embodiment according to FIG. 1, so that second region 22.2 is enclosed on all four sides by first region 22.1.

Figure 4:
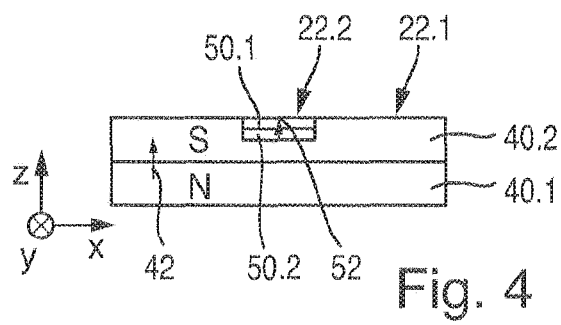
FIG. 4 shows a schematic sectional illustration of an embodiment of a measuring system of the invention.

The measuring system of FIG. 4 has a main magnet 40 with a south pole 40.1 and a north pole 40.2 following south pole 40.1 in the z-direction, so that first region 22.1 of top side 22 of magnet arrangement 20 is formed only by a north pole of main magnet 40. Secondary magnet 50 also has a vertical stacking of the poles, whereby north pole 50.1 is arranged in the y-direction in front of south pole 50.2, so that main magnetization direction 42 runs counter to secondary magnetization direction 52.

According to a further embodiment, main magnetization direction 42 runs counter to the z-axis, whereas secondary magnetization direction 52 runs parallel to the z-axis. The poles are respectively arranged reversed.

Figure 5:
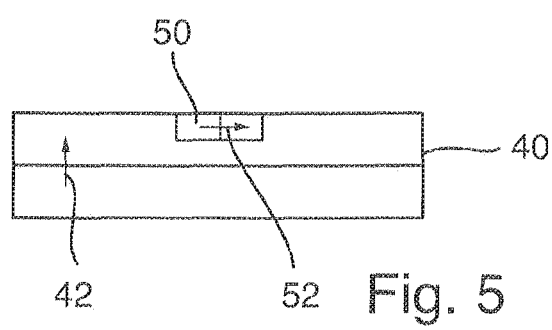
FIG. 5 shows a schematic sectional illustration of an embodiment of a measuring system of the invention.
Figure 6:
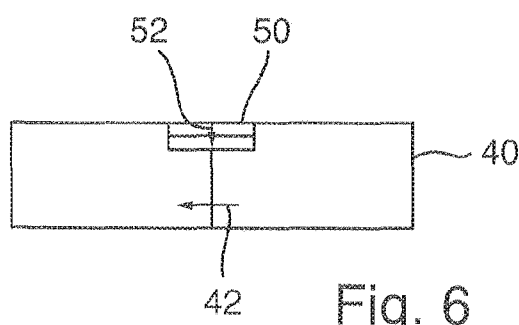
FIG. 6 shows a schematic sectional illustration of an embodiment of a measuring system of the invention.

Further possible arrangements of the poles of main magnet 40 and of secondary magnet 50 are shown in FIGS. 5 and 6.

In FIG. 5, the poles of main magnet 40 are arranged one after the other along the z-direction, whereas the poles of secondary magnet 50 are arranged one after the other along the x-direction. In this case, main magnetization direction 42 runs parallel or antiparallel to the z-direction and secondary magnetization direction 52 parallel or antiparallel to the x-direction. Correspondingly, depending on the arrangement of the poles of main magnet 40 and of secondary magnet 50, i.e., depending on the magnetization direction, four different magnetic field profiles can be achieved.

In contrast to FIG. 5, the poles of main magnet 40 are arranged one after the other along the x-direction in FIG. 6, whereas the poles of secondary magnet 50 follow one another along the z-direction. In this case, main magnetization direction 42 runs antiparallel or parallel to the x-direction and secondary magnetization direction 52 antiparallel or parallel to the z-direction. Correspondingly, depending on the arrangement of the poles of main magnet 40 and of secondary magnet 50, i.e., depending on the magnetization direction, four different magnetic field profiles can be achieved.

The exemplary embodiments shown in FIGS. 7 to 10 each comprise two secondary magnets 50, 500 as well as two magnetic field sensors 30, 300, a magnetic field sensor 30, 300 at least partially covering a secondary magnet 50, 500 in a projection counter to the z-direction.

Figure 7:
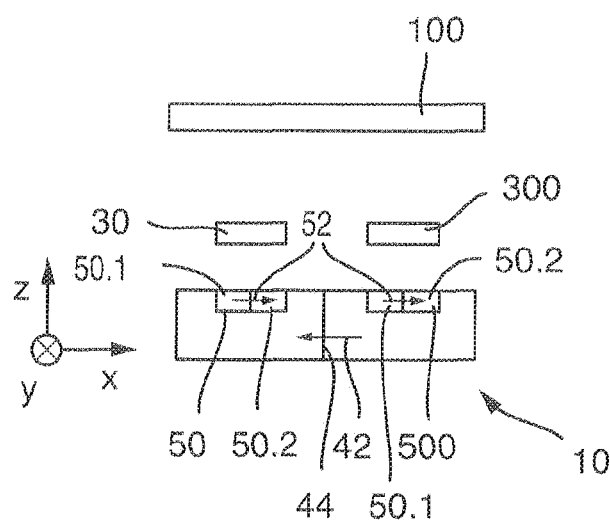
FIG. 7 shows a schematic sectional illustration of an embodiment of a measuring system of the invention.

The measuring system 7 shown in FIG. 7 has a main magnet 40 with poles arranged one after the other along the x-direction, south pole 40.2 being arranged either before or after north pole 40.1. In the present case, only the arrangement which is antiparallel with respect to the x-direction is shown. A first secondary magnet 50 and a second secondary magnet 500 are arranged symmetrically to boundary surface 44 between south pole 40.2 and north pole 40.1 of main magnet 40. Secondary magnets 50 and 500 are each arranged in a recess in the region of a pole of main magnet

50. North pole 50.1 and south pole 50.2 of secondary magnets 50 and 500 are arranged one after the other in the x-direction, whereby first secondary magnetization direction 52 of first secondary magnet 50 to a second secondary magnetization direction 520 of second secondary magnet 500 runs parallel or antiparallel to the x-direction.

Figure 8:
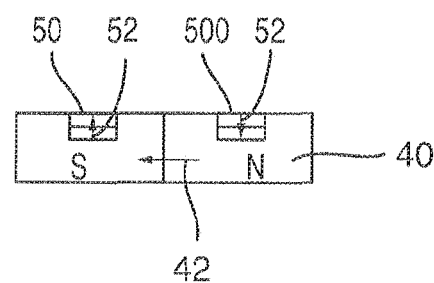
FIG. 8 shows a schematic sectional illustration of an embodiment of a measuring system of the invention.

South pole 50.2 and north pole 50.1 of the two secondary magnets 50 and 500 are arranged one after the other along the z-direction according to the embodiment of FIG. 8, whereby secondary magnetization direction 52 of first secondary magnet 50 runs parallel or antiparallel to secondary magnetization direction 520 of second secondary magnet 500. Overall eight different combinations of the magnetization directions are possible.

In the present case, an antiparallel embodiment with respect to the x-direction is shown for main magnetization direction 42, whereas secondary magnetization direction 52 of first secondary magnet 50 runs parallel with respect to the z-direction and secondary magnetization direction 520 of second secondary magnet 500 runs antiparallel to the z-direction.

Figure 9:
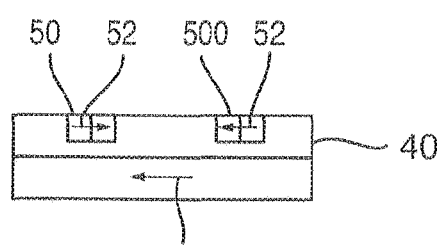
FIG. 9 shows a schematic sectional illustration of an embodiment of the measuring system of the invention.
Figure 10:
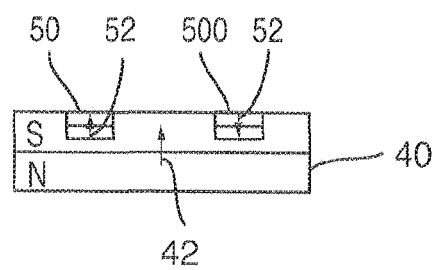
FIG. 10 shows a schematic sectional illustration of an embodiment of a measuring system of the invention.

In contrast to the embodiments in FIGS. 7 and 8, the main magnet according to the embodiments in FIGS. 9 and 10 has a main magnetization direction 42 running parallel or antiparallel to the z-direction, because north pole 40.1 and south pole 40.2 are arranged one after the other along the z-direction.

In the present case, a parallel embodiment with respect to the z-direction is shown for main magnetization direction 42 in FIG. 9, whereas secondary magnetization direction 52 of first secondary magnet 50 runs parallel with respect to the x-direction and secondary magnetization direction 52 of second secondary magnet 500 runs antiparallel to the x-direction.

In the present case, a parallel embodiment with respect to the z-direction is shown for main magnetization direction 42 in FIG. 10, whereas secondary magnetization direction 52 of first secondary magnet 50 runs parallel with respect to the z-direction and secondary magnetization direction 52 of second secondary magnet 500 runs antiparallel to the z-direction.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A measuring system comprising:
a magnetic device for generating a magnetic field; and
at least one magnetic field sensor for detecting a flux density of the magnetic field at least in a first spatial direction,
wherein the magnetic device has a top side facing the at least one magnetic field sensor,
wherein the at least one magnetic field sensor is spaced at a first distance from the top side of the magnetic device,
wherein the magnetic device has a main magnet having two permanent magnetic poles with a main magnetization direction for generating a main magnetic field,
wherein the magnetic device has at least one secondary magnet having two permanent magnetic poles with a secondary magnetization direction for generating a secondary magnetic field,
wherein the main magnet has larger dimensions than the at least one secondary magnet,
wherein the magnetic field is formed by superimposing the main magnetic field and the secondary magnetic field,
wherein the secondary magnetic field at least partially compensates the main magnetic field in the first spatial direction,
wherein the top side of the magnetic device is formed as a planar surface with a first surface region and a second surface region,
wherein the first surface region is formed by at least one pole of the main magnet,
wherein the second surface region is formed by at least one pole of the at least one secondary magnet,
wherein the at least one magnetic field sensor at least partially covers the second surface region in a projection extending substantially perpendicular to the top side of the magnetic device, and
wherein the at least one secondary magnet contacts the main magnet on four sides of the at least one secondary magnet, the four sides being orthogonal to the top side, or wherein a bottom side of the at least one secondary magnet opposite the top side contacts a bottom surface of at least one recess, the bottom surface being spaced apart from the top side in a first direction orthogonal to the top side such that the at least secondary magnet is arranged between the bottom surface and the at least one magnetic field sensor.

2. The measuring system according to claim 1, wherein the second surface region of the top side is completely enclosed by the first surface region or the second surface region is surrounded by the first surface region on two opposite sides.

3. The measuring system according to claim 1, wherein the magnetic device is cuboid.

4. The measuring system according to claim 1, wherein the at least one secondary magnet is cuboid, and wherein the at least one recess has a negative shape of the secondary magnet.

5. The measuring system according to claim 1, wherein the magnetic device is cylindrical, and wherein a base surface forms the top side of the magnetic device.

6. The measuring system according to claim 1, wherein the main magnetization direction of the main magnet is oriented in a substantially same or reverse direction as the secondary magnetization direction of the at least one secondary magnet.

7. The measuring system according to claim 1, further comprising a first secondary magnet with a first secondary magnetization direction and a second secondary magnet with a second secondary magnetization direction.

8. The measuring system according to claim 7, wherein the first secondary magnetization direction runs in a substantially same or reverse direction to the second secondary magnetization direction.

9. The measuring system according to claim 8, wherein the measuring system comprises a first magnetic field sensor and a second magnetic field sensor, wherein the first magnetic field sensor and the second magnetic field sensor are arranged next to one another in a plane extending parallel to the top side of the magnetic device, and wherein the first magnetic field sensor at least partially covers the first secondary magnet and the second magnetic field sensor of the second secondary magnet in a projection substantially perpendicular to the top side.

10. The measuring system according to claim 1, wherein the main magnetization direction of the main magnet runs orthogonal or substantially parallel to the top side of the magnetic device.

11. The measuring system according to claim 1, wherein the secondary magnetization direction of the secondary magnet runs orthogonal or substantially parallel to the top side of the magnetic device.

12. The measuring system according to claim 1, wherein the magnetic device and the at least one magnetic field sensor are integrated in a component package, the component package being designed for mounting on a circuit board.

13. The measuring system according to claim 1, wherein the measuring system has an encoder which is movable at least in one direction relative to the magnetic device.

14. A measuring system comprising:
a magnetic device for generating a magnetic field; and
at least one magnetic field sensor for detecting a flux density of the magnetic field at least in a first spatial direction,
wherein the magnetic device has a top side facing the at least one magnetic field sensor,
wherein the at least one magnetic field sensor is spaced at a first distance from the top side of the magnetic device,
wherein the magnetic device has a main magnet having two permanent magnetic poles with a main magnetization direction for generating a main magnetic field,
wherein the magnetic device has a secondary magnet having two permanent magnetic poles with a secondary magnetization direction for generating a secondary magnetic field,
wherein the main magnet has larger dimensions than the secondary magnet,
wherein the magnetic field is formed by superimposing the main magnetic field and the secondary magnetic field,
wherein the secondary magnetic field at least partially compensates the main magnetic field in the first spatial direction,
wherein the top side of the magnetic device is formed as a planar surface with a first surface region and a second surface region,
wherein the first surface region is formed by at least one pole of the main magnet,
wherein the second surface region is formed by at least one pole of the secondary magnet,
wherein the at least one magnetic field sensor at least partially covers the second surface region in a projection extending substantially perpendicular to the top side of the magnetic device, and
wherein the main magnetization direction between the two permanent magnetic poles of the main magnet is oriented orthogonal to the secondary magnetization direction between the two permanent magnetic poles of the secondary magnet.

\* \* \* \* \*